US010816580B2

(12) United States Patent
Minich et al.

(10) Patent No.: US 10,816,580 B2
(45) Date of Patent: Oct. 27, 2020

(54) ELECTRIC METER CONTACT ARC DETECTOR EMPLOYING DUAL-PURPOSED INDUCTIVE COMPONENTS

(71) Applicant: Landis+Gyr LLC, Lafayette, IN (US)

(72) Inventors: Mark David Minich, Lafayette, IN (US); Robert Rapsinski, West Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 260 days.

(21) Appl. No.: 15/878,658

(22) Filed: Jan. 24, 2018

(65) Prior Publication Data

US 2019/0227105 A1 Jul. 25, 2019

(51) Int. Cl.
*G01R 22/06* (2006.01)
*G01R 31/12* (2020.01)

(52) U.S. Cl.
CPC ....... *G01R 22/068* (2013.01); *G01R 31/1272* (2013.01)

(58) Field of Classification Search
CPC combination set(s) only.
See application file for complete search history.

(56) References Cited

U.S. PATENT DOCUMENTS

| 5,432,455 A * | 7/1995 | Blades | G01R 31/66 324/536 |
|---|---|---|---|
| 9,594,107 B1 | 3/2017 | Lawton | |
| 2014/0327449 A1 | 11/2014 | Shuey et al. | |
| 2016/0084884 A1 * | 3/2016 | Voisine | G01R 22/065 324/110 |

* cited by examiner

*Primary Examiner* — Lee E Rodak
*Assistant Examiner* — Brent J Andrews
(74) *Attorney, Agent, or Firm* — Kilpatrick Townsend & Stockton LLP

(57) ABSTRACT

An electricity meter includes a pair of terminals configured to connect in-line with a power line, an electrical conductor within the electric meter connecting the pair of terminals through a switch that includes an electric motor with an inductive coil, an inductive coil coupled to the electrical conductor, and a metrology circuit operatively connected to the electric motor in the switch. The metrology circuit includes a current sensor electrically connected to the inductive coil to measure an electric current that flows between the pair of terminals through the electrical conductor and an arc detection circuit electrically connected to one of the inductive coil coupled to the electrical conductor or the inductive coil in the electric motor, the arc detection circuit being configured to detect electrical arcs between the pair of terminals and the power line.

9 Claims, 3 Drawing Sheets

ELECTRIC METER CONTACT ARC DETECTOR EMPLOYING DUAL-PURPOSED INDUCTIVE COMPONENTS

TECHNICAL FIELD

This disclosure relates to electric meters generally and, more particularly, to electric meters that can detect the electromagnetic signatures of arcs between terminals or other components in the electric meter or a socket or service panel that is connected to the electric meter.

BACKGROUND

Electricity meters are devices that measure and/or meter aspects of energy provided to a load. The load may be a residence, business, or even part of a larger electricity distribution system. Commonly available meters include electromechanical meters and electronic meters. Electromechanical meters employ a rotating disk that rotates in response to electric and magnetic fields induced by the electricity passing to the load. As is known in the art, the disk rotation speed is a function of the amount of electricity delivered to the load. Mechanical counters accumulate the number of disk rotations, which is indicative of energy consumed by the load. In some cases, an electromechanical meter can employ processing circuitry to perform additional operations with the consumption information provided by the rotating disk.

Electronic meters typically employ processing circuitry instead of the rotating disk and mechanical counters. In such meters, sensors within the meter detect the voltage and current that is delivered to the load. Circuitry within the meter converts the sensed voltage and current into digital values. Processing circuitry then employs digital signal processing to calculate consumed energy, among other things, from the digital values. Electronic meters provide greater flexibility in the types of energy consumption information that they may calculate, track, and store.

Regardless of the style of meter, electricity meters are typically installed in or near the exterior of a building. As a result, electricity meters are often subjected to a wide range of environmental and electrical conditions, and are thus designed to withstand extremes in weather, as well as some degree of voltage and current swings. Some electric meters include arc detection circuits that can detect the electromagnetic signatures of electrical arcs that may occur between the terminals of the electric meter and the power line to which the electric meter is connected or between other electrical contacts within the electric meter itself. Electrical arcs may occur in situations in which the electrical meter or the socket that receives the electrical meter have damaged components or loose connections that do not enable the proper flow of electric current. Furthermore, the electric arcs themselves often damage contactors or other components within the electric meter or other elements that are connected to the electric meter.

FIG. 1 depicts a prior-art electric meter 100 that includes an arc detection circuit 161 in a metrology circuit 150 that is connected to a meter base 120. In the embodiment of FIG. 1, the arc detection circuit 161 detects the electromagnetic signatures of arcs that may occur between the terminals 124A, 124B, 128A, and 128B and an external electrical socket (not shown) that connects the electrical meter 100 in-line with a power line. In particular, the electric meter 100 includes an inductor 140 that is mounted on a meter base 120 proximate to the electrical conductors 126A and 126B that carry electricity between the terminal pairs 124A/128A and 124B/128B, respectively. The inductor 140 is not directly connected to the electrical conductors 126A/126B, but the electrical signals in the electrical conductors 126A/126B can produce an induced current in the inductor 140 via induction as is generally known in the art. The inductor 140 acts as an antenna that receives a portion of the electromagnetic energy that the arc produces, and the arc detection circuit 161 detects the electromagnetic signature of the arc based on signals received from the inductor 140. In the embodiment of FIG. 1, the arc detection circuit 161 detects the electromagnetic signature of an electrical arc and generates a signal if the electromagnetic arc signature is detected. A control device 180 in the electric meter 100 is configured to produce an output signal or take some other action if electrical arcs are detected. One commercially available embodiment of the arc detection circuit 161 is produced by Tesco Electric Ltd. of Regina Saskatchewan, Canada. Additional aspects of one embodiment of the arc detection circuit are described in U.S. Pat. No. 9,594,107.

One drawback of the electric meter 100 of FIG. 1 is that additional elements of the electric meter that perform arc detection add to the complexity of the electric meter and require additional testing to ensure that the additional components of the electric meter 100 are operational. Consequently, improvements to electric meters that perform arc detection would be beneficial.

SUMMARY

In one embodiment, an electric meter has been developed. The electric meter includes a first pair of terminals configured to connect in-line with a power line, a first electrical conductor within the electric meter connecting the first pair of terminals through a switch, an inductive coil coupled to the first electrical conductor, and a metrology circuit operatively connected to the electric motor in the switch. The switch further includes a contactor that connects the first pair of terminals in a closed position and disconnects the first pair of terminals in an opened position and an electric motor including an inductive coil, the electric motor being configured to move the contactor into the closed position and the opened position. The metrology circuit further includes a current sensor electrically connected to the inductive coil to enable measurement of an electric current that flows between the first pair of terminals through the first electrical conductor and an arc detection circuit electrically connected to one of the inductive coil coupled to the first electrical conductor or the inductive coil in the electric motor, the arc detection circuit being configured to detect electrical arcs between the first pair of terminals and the power line.

In another embodiment, an electric meter has been developed. The electric meter includes a first pair of terminals configured to connect in-line with a power line, the first pair of terminals being electrically connected by a first electrical conductor within the electric meter, an inductive coil coupled to the first electrical conductor, and a metrology circuit. The metrology circuit includes a current sensor electrically connected to the inductive coil to enable measurement of an electric current that flows between the first pair of terminals through the first electrical conductor and an arc detection circuit electrically connected to the inductive coil to detect electrical arcs between the first pair of terminals and the power line.

In another embodiment, an electric meter has been developed. The electric meter includes a first pair of terminals configured to connect in-line with a power line, a first electrical conductor connecting the first pair of terminals within the electric meter through a switch, and a metrology circuit operatively connected to the electric motor in the switch. The switch further includes a contactor that connects the first pair of terminals in a closed position and disconnects the first pair of terminals in an opened position and an electric motor including an inductive coil, the electric motor being configured to move the contactor into the closed position and the opened position. The metrology circuit further includes an arc detection circuit electrically connected to the inductive coil in the electric motor to detect electrical arcs between the first pair of terminals and the power line.

BRIEF DESCRIPTION OF THE DRAWINGS

The foregoing aspects and other features of an electric meter with a contact arc detector that includes dual-purposed inductive components are explained in the following description, taken in connection with the accompanying drawings.

DETAILED DESCRIPTION

Figure 1:
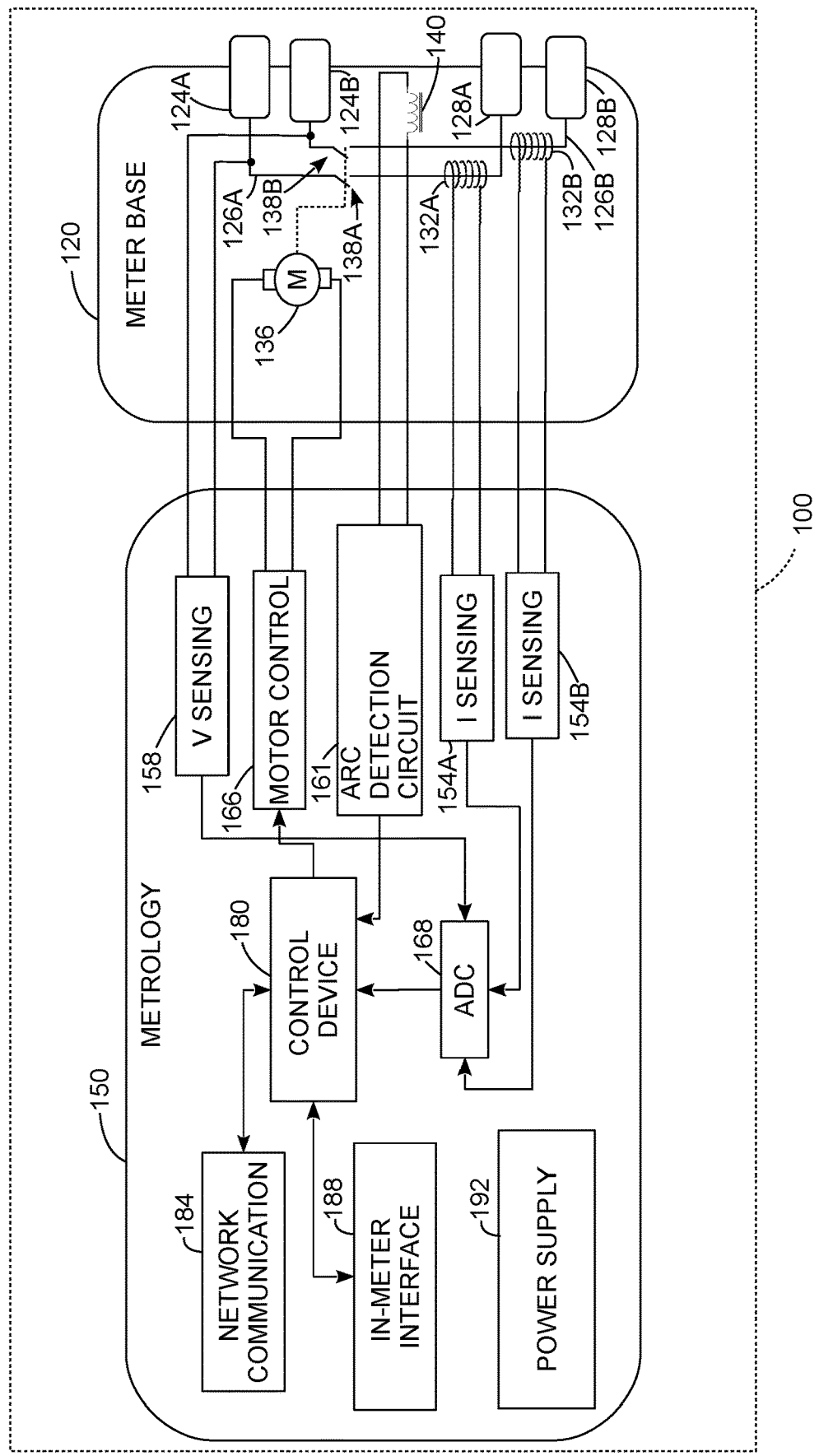
FIG. 1 is a schematic diagram of a prior-art electric meter that includes an arc detection circuit.

For a general understanding of the environment for the device disclosed herein as well as the details for the device, reference is made to the drawings. In the drawings, like reference numerals designate like elements.

As used herein, the term "metrology circuit" refers to any suitable circuit that detects, measures, and determines one or more electricity and/or electrical energy consumption values based on energy flowing between terminals of an electric meter that are connected in-line with a power line between an electric power source and the load that receives the electric power. In one common configuration, an electrical grid or other generation source is connected to one set of terminals and the load that receives the electrical power is connected to the other set of terminals. The electric power in the power line flows through the electric meter and the metrology circuit measures various aspects of the electrical signal including, but not necessarily limited to, voltage and current. A non-limiting example of a suitable metrology circuit that is also configured to detect electrical arcs is described below in connection with FIG. 2 and FIG. 3.

Figure 2:
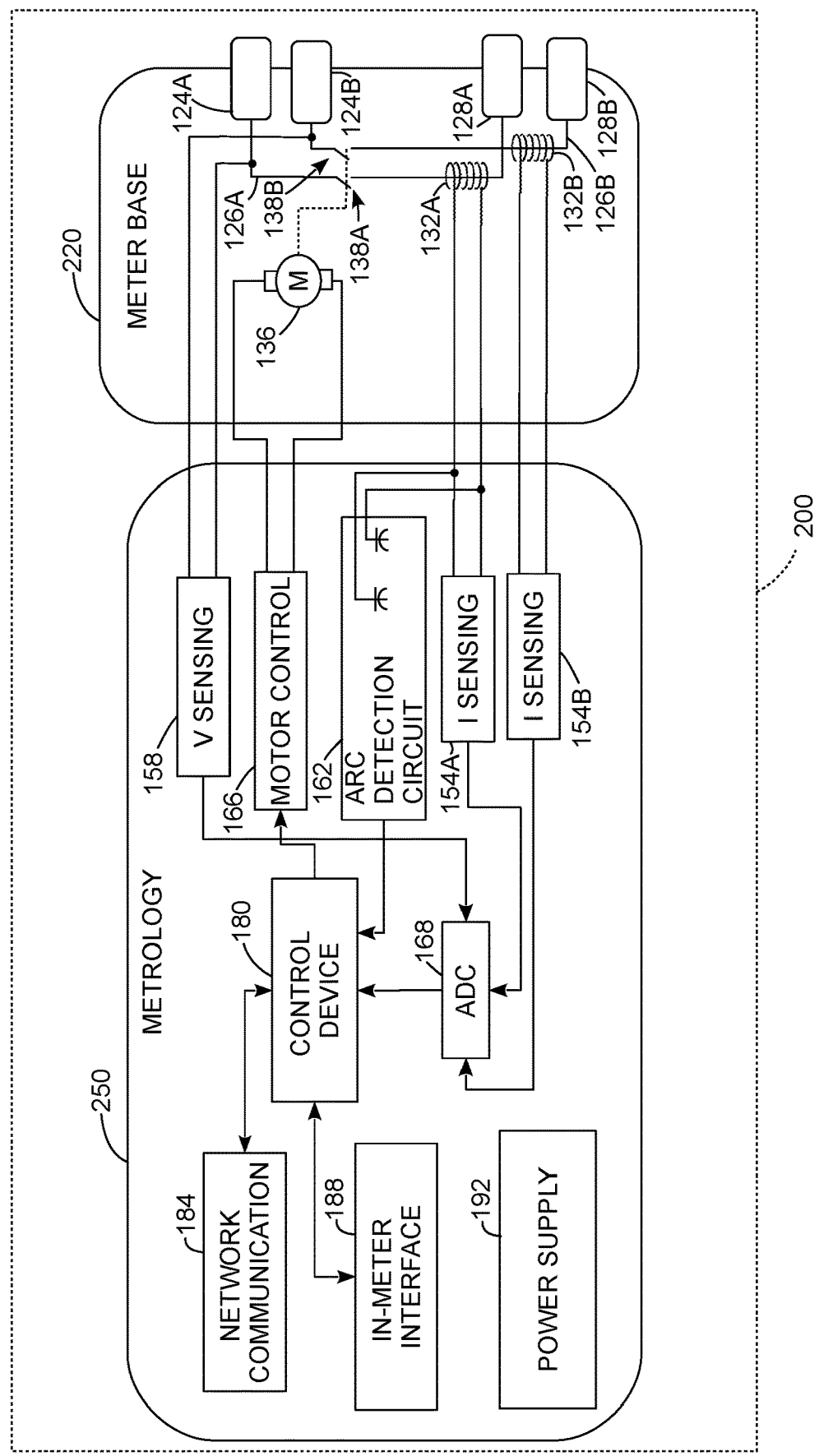
FIG. 2 is a schematic diagram of an electric meter that includes an arc detection circuit that is electrically connected to an inductive coil current transformer whose primary purpose is to measure current that flows through an electrical conductor in the electric meter.
Figure 3:
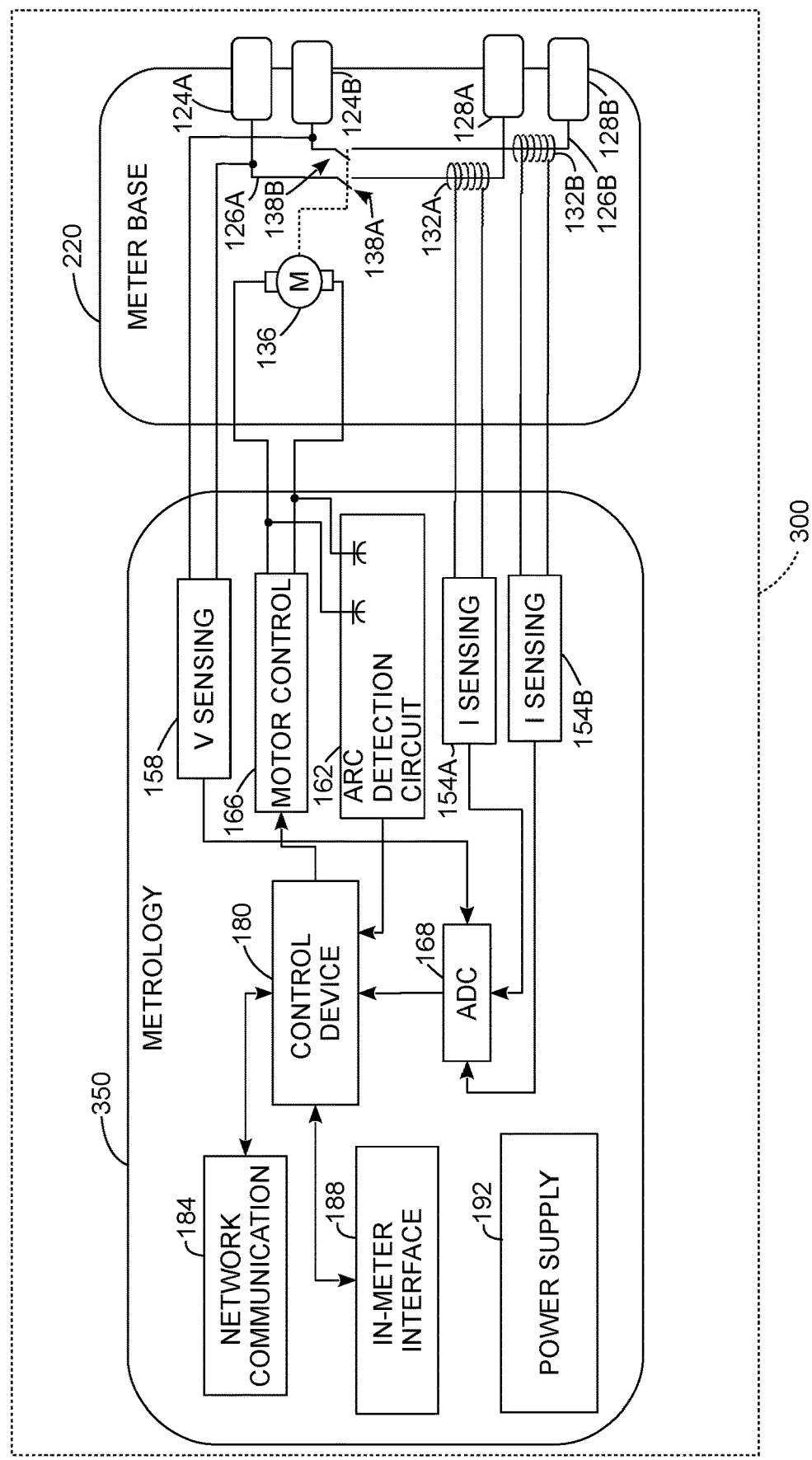
FIG. 3 is a schematic diagram of an electric meter that includes an arc detection circuit that is electrically connected to an inductive coil in an electric motor that electrically connects and disconnects terminals in the electric meter.

FIG. 2 and FIG. 3 depict embodiments of electric meters 200, and 300, respectively, which include an arc detection circuit. Both of the electric meters 200 and 300 include common components that are described in more detail below.

Each of the electric meters 200 and 300 includes a meter base 220 and metrology circuits 250 (FIG. 2) or 350 (FIG. 3) that are supported by and at least partially contained within a housing of the electric meter. The meter base 220 includes two pairs of terminals 124A/128A and 124B/128B that are electrically connected together by conductors 126A and 126B, respectively. The meter base 220 includes an electromechanical switch that further includes a pair of contactors 138A and 138B and an electric motor 136.

In the meter base 220, each of the terminals 124A, 124B, 128A, and 128B is formed from an electrically conductive member, often referred to as a "blade" or a "stab", which extends from the housing of the electric meter to engage a socket that is connected to a power line (socket and power line not shown). Each of the terminal pairs 124A/128A and 124B/128B is configured to connect in-line with a conductor in a powerline where all of the power that passes through the power line from an energy source to a load passes through the terminal pairs 124A/128A and 124B/128B to a load. The terminal pairs 124A/128A and 124B/128B and the electrical conductors 126A and 126B effectively become part of the power line connected between the generation source and the load when the electric meter embodiments 200 and 300 are connected to the socket. While FIG. 2 and FIG. 3 depict two pairs of terminals with two conductors that are configured to be connected in-line with a power line that includes two conductors (and that often includes a neutral conductor not shown in the drawings), alternative embodiments optionally include only one pair of terminals for a single conductor or additional pairs of terminals with additional conductors to enable monitoring of power lines that include more than two conducting lines, such as three-phase power lines.

The meter base 220 includes inductive coils 132A and 132B that are inductively coupled to the electrical conductors 126A and 126B, respectively. As described in further detail below, the inductive coils 132A and 132B are electrically connected to electrical current sensors 154A and 154B in the metrology circuits 250/350. The alternating current waveforms in the electrical conductors 126A and 126B induce a current in the inductive coils 132A and 132B, respectively, that the metrology circuit 150 uses to monitor electrical current levels in the power line. The inductive coils 132A and 132B are also referred to as "coil transformers" since in some embodiments the inductive coils 132A and 132B form one set of coils in a current transformer in which a second set of coils produce a current measurement signal.

In the embodiments of FIG. 2-FIG. 3, the electrical conductors 126A and 126B pass through contactors 138A and 138B, respectively, in a switch that can connect the terminal pairs 124A/128A and 124B/128B together or disconnect the terminal pairs 124A/128A and 124B/128B of the electric meters 200 or 300. In the meter base 220, the contactors 138A and 138B are physical switching elements that move between a closed position and an opened position. In the closed position the contactors 138A and 138B establish an electrical connection between the terminal pairs 124A/128A and 124B/128B, respectively, through the electrical conductors 126A and 126B, respectively. In the opened position, the contactors 138A and 138B disconnect the terminal pairs 124A/128A and 124B/128B, respectively, and prevent a flow of electrical current through the electrical conductors 126A and 126B, respectively. In the switch, the electric motor 136 moves the contactors 138A and 138B between the closed and opened positions to operate the switch based on control signals from the metrology circuits 250 or 350.

The terms "electric motor" or "motor" as used herein refer to any electromechanical device that includes an electromagnetic coil and that is configured to move at least one contactor into closed and opened position in a switch. In the meter base 220 that is depicted in FIG. 2 and FIG. 3, the electric motor 136 is configured to move the contactors 138A and 138B into the closed and opened positions.

Different embodiments of the electric motor 136 include, for example, a latching or non-latching magnetic relay switch in which the electric motor 136 may be an electromagnetic coil that generates an electromagnetic field to move the contactors 138A and 138B to the opened or closed position when the electromagnetic coil energizes to produce an electromagnetic field without a direct physical connection between the electric motor 136 and the contactors 138A/138B. In another embodiment, the electric motor 136 includes an armature that is physically connected to the contactors 138A and 138B, either directly or indirectly, to move the contactors between the closed and opened positions when the electromagnetic coil in the electric motor 136 energizes to rotate the armature. Various types of motors including, but not limited to, relay and solenoid coils, and brushed or brushless rotary armature electric motors can be used in the meter base 220. The embodiment of the meter base 220 in FIG. 2 and FIG. 3 includes a single motor 136 that operates both of the contactors 138A and 138B in a double-pole single-throw (DPST) switch configuration, but alternative embodiments could use separate motor elements for each of the contactors 138A and 138B. As described in further detail below, when the electric motor 136 is not energized to move the contactors 138A and 138B between the closed and opened positions, the electromagnetic coil in the electric motor 136 also serves as an inductive coil that is connected to the arc detection circuit 162 in the embodiment of FIG. 3.

Referring to the metrology circuits of FIG. 2 and FIG. 3, both of the metrology circuits 250/350 include current sensors 154A/154B, voltage sensors 158, arc detection circuit 162, and a motor control circuit 166. The metrology circuits 250/350 further include analog-to-digital converters 168, a digital control device 180, network communication device 184, and in-meter control interface 188. The electric meters 250/350 receive electrical power for operation from the power line via the terminal pairs 124A/128A and 124B/128B that are connected to a power supply 192 (connections omitted for clarity). The power supply 192 is, for example, a switched capacitor power supply or other suitable conversion circuit that produces direct current (DC) electrical output power from the alternating current (AC) power received at the terminals to provide electrical the components in the electric meters 200 and 300. The power supply 192 provides electrical power to the components in the metrology circuits 250/350 and the meter base 220 that require electrical power during operation of the electric meters 200 and 300.

In the metrology circuits 250/350, the current sensors 154A/154B are each connected to one of the inductive coils 132A and 132B, respectively, to enable the current sensors to monitor the levels of electrical current in the electrical conductors 126A and 126B, respectively. In one embodiment, the current sensors 154A and 154B each includes a second set of coils that are coupled to the corresponding inductive coils 132A or 132B in a coil transformer arrangement. The coils in the current sensors 154A and 154B generate electrical currents that correspond to the current levels in the electrical conductors 126A and 126B, although at greatly reduced amplitudes to enable measurement of the current in an efficient manner and with the current sensors having galvanic isolation from the much higher current levels of the electrical conductors 126A and 126B. The current sensors 154A and 154B generate analog current measurement signals that are supplied to the ADC 168 to be provided as digital current level signals to the control device 180, although in an analog electrical meter an analog control circuit may receive the analog current measurement signals directly.

In the metrology circuits 250/350, the voltage sensors 158 are connected to both of the electrical conductors 126A and 126B. Each of the voltage sensors 158 is configured to generate an analog voltage measurement signal having a waveform representative of the voltage provided to the load through the power line. The outputs of the voltage sensors 158 are connected to the ADC 168 to enable the control device 180 to receive digitized representations of the measured voltage levels from the voltage sensors 158. In one embodiment, the voltage sensors 158 include a voltage divider circuit to bring the measured voltage waveform to a magnitude that is suitable for the ADC 168. The voltage sensors 158 may alternatively take other known forms.

As described above, the arc detection circuit 162 generates an output signal in response to detection of the electromagnetic signature of an electrical arc that occurs either between one or more of the terminals 124A, 124B, 128A, and 128B and the power line or, in some embodiments, between the contactors 138A and 138B and the electrical conductors 126A and 126B. The arc detection circuit 162 generates a signal in response to detecting the electromagnetic signature of the arc, which is depicted as a digital signal that is supplied to the control device 180 in FIG. 2 and FIG. 3, although an analog output signal may be generated in alternative embodiments. As described in further detail below, the metrology circuits 250/350 include different connections for the arc detection circuit 162 to various components in the meter base 220.

In the illustrative embodiments of the metrology circuits 250 and 350, the arc detection circuit 162 optionally includes one or more capacitors within the arc detection circuit 162 to form an inductor-capacitor (LC) circuit in conjunction with an inductive coil that is connected to the arc detection circuit 162. The LC circuit serves as a high-pass filter that enables the arc detection circuit 162 to ignore the lower frequency (e.g. 50 Hz or 60 Hz) AC electrical signals that pass between the terminal pairs 124A/128A and 124B/128B during normal operation of the electric meter 100 while passing the high-frequency components that are generated in the event of an electrical arc to the rest of the arc detection circuit 162. Alternative embodiments of the arc detection circuit 162 are also connected to the inductive coil, but do not include the capacitors that form an LC circuit using the inductive coil.

The motor control circuit 166 provides control signals and electrical power to operate the electric motor 136 to move the contactors 138A and 138B to the closed and opened positions. In the embodiments of the metrology circuits 250/350, the control device 180 is operatively connected to the motor control circuit 166 to enable the control device 180 to operate the electric motor 136 to control the switch in the meter base 220.

In the embodiments of FIG. 2 and FIG. 3, the control device 180 is a digital logic device that includes, for example, one or more microprocessors, microcontrollers, field programmable gate arrays (FPGAs), digital signal processors (DSPs), programmable logic controllers (PLCs), application specific integrated circuits (ASICs), and the like. In some embodiments, the control device 180 also includes one or more memory devices that store programmed software or firmware instructions that the control device 180 executes to operate the electric meters 200 and 300 in conjunction with the other components of the electric meters. In addition to the specific functions described herein, the control circuit 180 also performs metrology routines, display routines, communication routines, that are commonly associated with the operation of electric meters. As depicted in FIG. 2 and FIG. 3, the control device 180 receives input data from the current sensors 154A and 154B, the voltage sensor 158, and the arc detection circuit 162 either directly or indirectly via the ADC 168. While the arc detection circuit 162 is depicted as being separate from the control device 180 for illustrative purposes, in some embodiments all or a portion of the arc detection circuit 162 may be integrated with the control device 180. While the control device 180 of FIG. 2 and FIG. 3 is depicted as a digital logic device for illustrative purposes, in alternative embodiments an analog control device could perform the functions of the control device 180 that are described herein.

In the metrology circuits 250/350, the control device 180 is operatively connected to network communication device 184, the in-meter interface 188, and the motor control circuit 166 in addition to being connected to receive input data from the current sensors 154A/154B, the voltage sensors 158, and the arc detection circuit 162. The network communication device 184 is, for example, an analog modem or digital subscriber line (DSL) device that couples to a telephone network, an Ethernet transceiver that transmits data over a wired network, a local serial bus output such as RS-232 or Universal Serial Bus (USB), or either or both of a wireless local area network (WLAN) or wide area network (WWAN) transceiver that transmits metrology data to external monitoring systems. The external monitoring systems include, for example, electric utilities, site owners, or first responders such as fire departments that may use the metrology data for various purposes. In particular, the external monitoring systems may receive alarm messages from the electric meters 200 and 300 in response to detection of arcs. Additionally, in some configurations the controller 180 can receive command messages from external control systems using the network communication device 184. In the metrology circuits 250/350, the in-meter interface 188 provides a visual and in some instances audible output device that enables manual meter reading and manual inspection of the electric meter to determine if the meter has triggered an alarm due to the detection of electrical arcs. Examples of the output devices include mechanical gauges, indicator lights, LCD or LED display screens, alarm bells or speakers and the like. The in-meter interface optionally includes control inputs that enable an operator to send commands to the control device 180 while physically present at the electric meter. While the metrology circuits 250/350 include both the network communication device 184 and the in-meter interface 188, some embodiments of electric meters that detect the electromagnetic signatures of arcs only include a network communication device 184 or an in-meter interface 188, but not both elements. For example, some electric meters have no need to communicate with a remote system via a data network and only include the in-meter interface 188, while other electric meters rely exclusively on the network communication device 184 to transmit the meter data and do not include the in-meter interface 188.

During operation of the electric meters 200 and 300, the control device 180 can perform one or more actions in response to receiving a signal from the arc detection unit 162 that indicates the occurrence of an arc between one or more of the terminals 124A, 124B, 128A, 128B and the power line or between the contactors 138A and 138B and the electrical conductors 126A and 126B, respectively. In one configuration, the control device 180 generates an alert output such as a visual or audible alarm using the in-meter interface 188 or transmits an alarm message indicating the detection of the arc to an external monitoring system using the network communication device 184. In some configurations, the control device 180 operates the motor control circuit 166 and the electric motor 136 in the switch to disconnect the contactors 138A and 138B to disconnect the terminal pairs 124A/128A and 124B/128B in response to detecting repeated occurrences of arcing that could indicate a loose connection or damage in at least one of the electric meter, the socket, and service panel.

While the metrology circuits 250/350 and the meter base 220 of FIG. 2 and FIG. 3 are depicted as separate elements for illustrative purposes, in some embodiments the components in the metrology circuits 250/350 and the meter base 220 are mounted to a single printed circuit board or other suitable base. In other embodiments, the metrology circuit and the meter base are formed on different circuit boards ("daughterboards") that are electrically connected to each other. Those of skill in the art will recognize that alternative embodiments to those shown in FIG. 2 and FIG. 3 may mount components in the metrology circuits 250/350 in the meter base 220 or vice-versa.

Referring to the electric meter 200 of FIG. 2 in more detail, the arc detection circuit 162 is electrically connected to the inductive coil 132A that is also inductively coupled to the electrical conductor 126A and the current sensor 154A. In one embodiment, the inductive coil 132 serves as the inductor in an inductor-capacitor (LC) circuit that also includes the capacitors within the arc detection circuit 162 that are located within the metrology circuit 250 in the embodiment of FIG. 2. In the illustrative embodiment of FIG. 2, the arc detection circuit 162 is electrically connected to the leads of the inductive coil 132A on the printed circuit board of the metrology circuit 250, although the arc detection circuit 162 could also be connected at any point between the current sensor 154A and the inductive coil 132A on the meter base 220. In alternative embodiments, an arc detection circuit is connected to the inductive coil 132A as depicted in FIG. 2 although the inductive coil 132A is not connected to one or more capacitors in an LC circuit.

Even though the inductive coil 132A is inductively coupled to the electrical conductor 126A for normal monitoring of electrical current via the current sensor 154A, the arc detection circuit 162 can use the inductive coil 132A to sense electrical arcs between any of the terminals 124A, 124B, 128A, and 128B and the power line or between either of the contactors 138A and 138B and the electrical conductors 126A and 126B, respectively. The broad-spectrum electrical noise produced by an arc can be detected using the inductive coil 132A as an antenna even if the arc does not pass directly through the electrical conductor 126A. Additionally, while FIG. 2 depicts the arc detection circuit 162 being connected to the inductive coil 132A, both of the inductive coils 132A and 132B are equally suited to being connected to the arc detection circuit 162. Thus, the electric meter 200 of FIG. 2 enables arc detection with the arc detection circuit 162 and the dual-purposed inductive coils without requiring the separate inductor 140 from the prior-art electric meter 100.

The electric meter 200 of FIG. 2 includes the switch with motor 136 and the contactors 138A and 138B for illustrative purposes, but alternative embodiments of the meter base 220 omit the switch. These embodiments do not include the electric motor 136 and the contactors 138A and 138B and instead include direct electrical connections of the conductors 126A and 126B between the terminals 124A/128A and 124B/128B, respectively. Similarly, embodiments of electric meters that omit the electric motor 136 may omit the motor control circuit 166 from the metrology board. In configurations that do not include the switch, the arc detection circuit 162 that is connected to at least one of the inductive coils 132A or 132B detects the electromagnetic signatures of arcs between the terminals 124A/124B and 128A/128B either within the electric meter 200 or between the electric meter 200 and the external electrical socket or a service panel that is connected to the socket and the electric meter 200.

Referring to the electric meter 300 of FIG. 3 in more detail, the arc detection circuit 162 is electrically connected to the electromagnetic coil in the electric motor 136. In the embodiment of FIG. 3, the electromagnetic coil in the electric motor 136 serves as an inductive coil that is connected to the arc detection circuit when the electric motor 136 is deactivated and the motor control circuit 166 does not energize the electromagnetic coil. In the illustrative embodiment of FIG. 3, the arc detection circuit 162 is electrically connected to the leads of the electric motor 136 on the printed circuit board of the metrology circuit 350, although the arc detection circuit 162 could also be connected at any point between the motor control circuit 166 and the electric motor 136 on the meter base 220. While FIG. 3 depicts the electromagnetic coil in the electric motor 136 acting as the inductor in an LC circuit with capacitors in the arc detection circuit 162, in alternative embodiments an arc detection circuit is connected to the electromagnetic coil in the electric motor 136 although the electromagnetic coil in the electric motor 136 is not connected to one or more capacitors in an LC circuit.

In the embodiment of FIG. 3, the arc detection circuit 162 can use the electromagnetic coil in the electric motor 136 to sense electrical arcs between any of the terminals 124A, 124B, 128A, and 128B and the power line or between either of the contactors 138A and 138B and the electrical conductors 126A and 126B, respectively. The broad-spectrum electrical noise produced by an arc can be detected using the inductive coil in the electric motor 136 even if the arc does not pass directly through the electric motor 136 because the electric motor 136 is mounted on the meter base 220 in close proximity to the electrical conductors 126A and 126B and the contractors 138A and 138B. Thus, the electric meter 300 of FIG. 3 enables arc detection with the arc detection circuit 162 and the dual-purposed inductive coil in the electric motor 136 without requiring the separate inductor 140 from the prior-art electric meter 100.

During activation of the electric motor 136, the energized electromagnetic coil in the electric motor 136 produces a great deal of noise that could be interpreted as an electrical arc by the arc detection circuit 162. The arc detection circuit 162 may generate an arc detection signal that is provided to the control device 180 during operation of the electric motor 136 even if no electrical arc occurs. In the electric meter 300, the control device 180 may optionally be configured to ignore the signal from the arc detection circuit in response to receiving the signal during a time period in which the electric motor in the switch is activated. As noted above, the control device 180 controls the electric motor 136 via the motor control circuit 166. Thus, in some embodiments the controller 180 identifies time periods during which the electric motor 136 is activated and ignores the signals from the arc detection circuit 162 during these time periods. Because the electric motor 136 is operated infrequently and for short durations during operation of the electric meter 300, the control device 180 can ignore signals from the arc detection unit 162 that are generated during the brief periods of operation of the electric motor 136 while still using the coil in the electric motor 136 as an inductive coil for the arc detection circuit 162 when the electric motor 136 is not activated.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. An electric meter comprising:
   a first pair of terminals configured to connect in-line with a power line;
   a first electrical conductor within the electric meter connecting the first pair of terminals through a switch, the switch further comprising:
      a contactor that connects the first pair of terminals in a closed position and disconnects the first pair of terminals in an opened position; and
      an electric motor including an inductive coil, the electric motor being configured to move the contactor into the closed position and the opened position;
   an inductive coil coupled to the first electrical conductor; and
   a metrology circuit operatively connected to the electric motor in the switch, the metrology circuit further comprising:
      a current sensor electrically connected to the inductive coil to enable measurement of an electric current that flows between the first pair of terminals through the first electrical conductor; and
      an arc detection circuit electrically connected to one of the inductive coil coupled to the first electrical conductor or the inductive coil in the electric motor, the arc detection circuit being configured to detect electrical arcs between the first pair of terminals and the power line.

2. The electric meter of claim 1 further comprising:
   a second pair of terminals configured to connect in-line with the power line, the second pair of terminals being electrically connected by a second electrical conductor within the electric meter, wherein the arc detection circuit is connected to the inductive coil coupled to the first electrical conductor and is further configured to detect electrical arcs between the second pair of terminals and the power line.

3. The electric meter of claim 1 further comprising:
   a second pair of terminals configured to connect in-line with the power line, the second pair of terminals being electrically connected by a second electrical conductor within the electric meter, wherein the arc detection circuit is connected to the inductive coil in the electric motor and is further configured to detect electrical arcs between the second pair of terminals and the power line.

4. The electric meter of claim 1, the arc detection circuit being electrically connected to the inductive coil coupled to the first electrical conductor and the arc detection circuit being further configured to detect electrical arcs between the contactor and the first electrical conductor.

5. The electric meter of claim 1, the arc detection circuit being electrically connected to the inductive coil in the electric motor and the arc detection circuit being further configured to detect electrical arcs between the contactor and the first electrical conductor.

6. The electric meter of claim 1, the arc detection circuit further comprising:
 a capacitor electrically connected to the one of the inductive coil coupled to the first electrical conductor or the inductive coil in the electric motor to form an inductor-capacitor (LC) circuit.

7. An electric meter comprising:
 a first pair of terminals configured to connect in-line with a power line, the first pair of terminals being electrically connected by a first electrical conductor within the electric meter;
 an inductive coil coupled to the first electrical conductor; and
 a metrology circuit comprising:
  a current sensor electrically connected to a pair of leads of the inductive coil to enable measurement of an electric current that flows between the first pair of terminals through the first electrical conductor; and
  an arc detection circuit electrically connected to the same pair of leads of the same inductive coil electrically connected to the current sensor to detect electrical arcs between the first pair of terminals and the power line,
  wherein the inductive coil is directly coupled to the current sensor and the arc detection circuit.

8. The electric meter of claim 7 further comprising:
 a second pair of terminals configured to connect in-line with the power line, the second pair of terminals being electrically connected by a second electrical conductor within the electric meter, wherein the arc detection circuit is further configured to detect electrical arcs between the second pair of terminals and the power line.

9. The electric meter of claim 7, the arc detection circuit further comprising:
 a capacitor electrically connected to the inductive coil to form an inductor-capacitor (LC) circuit.

* * * * *